US012690297B2

(12) United States Patent
Yeh et al.

(10) Patent No.: US 12,690,297 B2
(45) Date of Patent: Jul. 21, 2026

(54) EPITAXIAL STRUCTURE OF SEMICONDUCTOR LIGHT-EMITTING ELEMENT, SEMICONDUCTOR LIGHT-EMITTING ELEMENT, AND LIGHT-EMITTING DEVICE

(71) Applicant: Quanzhou Sanan Semiconductor Technology Co., Ltd., Nanan City (CN)

(72) Inventors: Meng-Hsin Yeh, Xiamen (CN); Zhousheng Jiang, Nanan City (CN); Bing-Yang Chen, Xiamen (CN); Dongpo Chen, Tianjin (CN); Chung-Ying Chang, Xiamen (CN)

(73) Assignee: Quanzhou Sanan Semiconductor Technology Co., Ltd., Nanan City (CN)

( * ) Notice: Subject to any disclaimer, the term of this patent is extended or adjusted under 35 U.S.C. 154(b) by 448 days.

(21) Appl. No.: 18/498,376

(22) Filed: Oct. 31, 2023

(65) Prior Publication Data

US 2024/0145627 A1    May 2, 2024

(30) Foreign Application Priority Data

Nov. 2, 2022    (CN) .......................... 202211361776.7

(51) Int. Cl.
| | |
|---|---|
| *H10H 20/81* | (2025.01) |
| *H10H 20/01* | (2025.01) |
| *H10H 20/812* | (2025.01) |
| *H10H 20/815* | (2025.01) |
| *H10H 20/825* | (2025.01) |

(52) U.S. Cl.
CPC .... *H10H 20/815* (2025.01); *H10H 20/01335* (2025.01); *H10H 20/812* (2025.01); *H10H 20/8215* (2025.01); *H10H 20/825* (2025.01)

(58) Field of Classification Search
CPC .......................... H10H 20/8215; H10H 20/815
See application file for complete search history.

(56) References Cited

U.S. PATENT DOCUMENTS

| | | | | |
|---|---|---|---|---|
| 2012/0187369 A1* | 7/2012 | Jeong | ................... | H10H 20/815 257/13 |
| 2012/0225539 A1* | 9/2012 | Figuet | .................... | C30B 25/02 257/E21.09 |
| 2015/0115223 A1* | 4/2015 | Kwak | .................. | H10D 62/102 257/22 |
| 2019/0348567 A1* | 11/2019 | Na | ....................... | H10H 20/811 |

* cited by examiner

*Primary Examiner* — Christopher A Johnson
(74) *Attorney, Agent, or Firm* — MUNCY, GEISSLER, OLDS & LOWE, P.C.

(57)    ABSTRACT

An epitaxial structure of a semiconductor light-emitting element includes an n-type layer, a V-pit control layer, a light-emitting layer, and a p-type layer stacked from bottom to top. The light-emitting layer includes a plurality of well layers and a plurality of barrier layers stacked alternately. The V-pit control layer includes a first superlattice layer, and a distance between a bottom surface of the V-pit control layer and a bottom surface of the first superlattice layer is less than or equal to 0.15 μm. The bottom surface of the first superlattice layer and a bottom surface of the light-emitting layer have a distance therebetween ranging from 0.05 μm to 0.3 μm, and each of the first superlattice layer and the light-emitting layer is an Indium (In)-containing layer. A semiconductor light-emitting element and a light-emitting device are also provided.

22 Claims, 6 Drawing Sheets

100

107
106
1053
1052 } 105
1051
1040
104
1043
103
102
1012 } 101
1011

A

D 104
1040    1043
1042
1041
1032
1031
1024
1023 } 102
1021

103
D2
D0
D1

EPITAXIAL STRUCTURE OF SEMICONDUCTOR LIGHT-EMITTING ELEMENT, SEMICONDUCTOR LIGHT-EMITTING ELEMENT, AND LIGHT-EMITTING DEVICE

CROSS-REFERENCE TO RELATED APPLICATION

This application claims priority to Chinese Invention Patent Application No. 202211361776.7, filed on Nov. 2, 2022.

FIELD

The disclosure relates to an epitaxial structure of a semiconductor light-emitting element, and a semiconductor light-emitting element and a light-emitting device including the same.

BACKGROUND

GaN-based light-emitting diodes (LEDs) have been widely employed in a variety of luminous source fields, such as backlighting or lighting of an appliance, lightening of a vehicle, and lightening decorations due to their high luminous efficiency. From a technical perspective, further improvement of luminous efficiency of LED chips is still a current industry focus. Luminous efficiency is mainly determined by two factors. The first one is a radiative recombination efficiency of electrons and holes in an active area, i.e., an internal quantum efficiency, and the second one is a light extraction efficiency. Methods for enhancing the internal quantum efficiency have been extensively reported, such as properly designing bandgaps of quantum wells, improving crystal quality, and increasing a hole injection efficiency of a p-type layer.

An epitaxial structure of a GaN-based LED may include an n-type GaN layer, an active layer, and a p-type GaN layer. In addition, the active layer is a periodic layered structure having alternately laminated GaN layers and InGaN layers. Because a lattice constant of the n-type GaN layer is different from that of InGaN layers of the active layer, polarization effect and lattice mismatch are very likely to occur, growth quality of crystals tends to be poor, and hence dislocation defects arise. If such dislocation defects are not effectively controlled, a large number of surface defects may be generated, bringing forth V-pit defects. In order to buffer a stress between the n-type GaN layer and the InGaN layers, a superlattice layer and/or a low-temperature layer may usually be designed to dispose therebetween. The superlattice layer includes an InGaN layer, which has a relatively lower indium (In) content than that of the InGaN layers of the active layer, and hence can effectively buffer the stress, control the growth quality of the crystals, and induce gradual opening of the V-pit defects. Nevertheless, the position of the V-pit defects typically falls within a lower portion of the active layer, so when a lower current density is provided, the V-pit defects may form and serve as a leakage channel, consequently reducing a luminous efficiency of an LED.

SUMMARY

Therefore, an object of the disclosure is to provide an epitaxial structure of a semiconductor light-emitting element, a semiconductor light-emitting element including the aforesaid epitaxial structure, and a light-emitting device including the aforesaid semiconductor light-emitting element that can alleviate at least one of the drawbacks of the prior art.

According to a first aspect of the disclosure, the epitaxial structure of the semiconductor light-emitting element includes an n-type layer, a V-pit control layer, a light-emitting layer, and a p-type layer which are stacked in such order from bottom to top. The light-emitting layer includes a plurality of well layers and a plurality of barrier layers stacked alternately, and the well layers have a bandgap energy less than a bandgap energy of the barrier layers. In addition, the V-pit control layer includes a first superlattice layer, and a distance between a bottom surface of the V-pit control layer and a bottom surface of the first superlattice layer is less than or equal to 0.15 $\mu$m. The bottom surface of the first superlattice layer and a bottom surface of the light-emitting layer have a distance therebetween ranging from 0.05 $\mu$m to 0.3 $\mu$m. Each of the first superlattice layer and the light-emitting layer is an indium (In)-containing layer.

According to a second aspect of the disclosure, the semiconductor light-emitting element includes the epitaxial structure of the first aspect.

Acceding to a third aspect of the disclosure, the light-emitting device includes the semiconductor light-emitting element of the second aspect.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
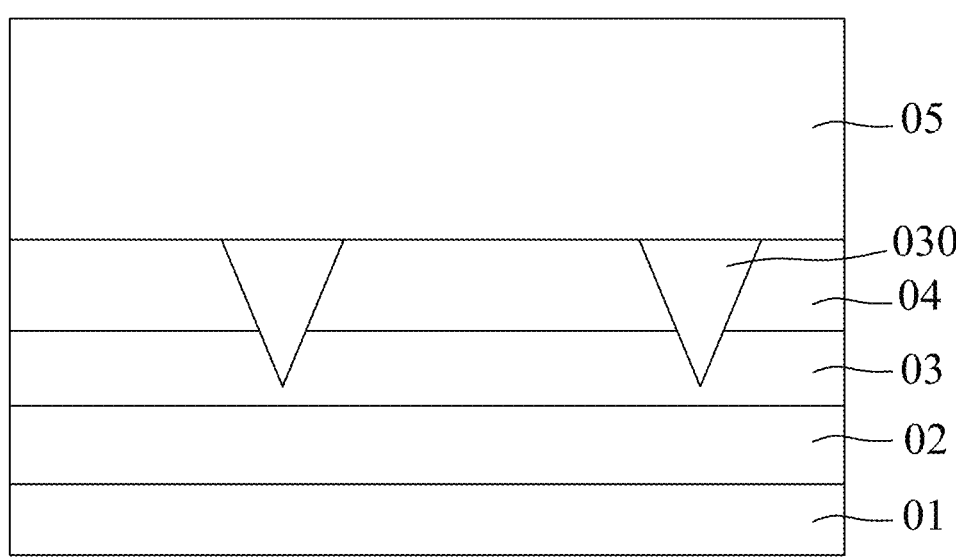
FIG. 1 is a schematic view illustrating an epitaxial structure of a prior art.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Referring to FIG. 1, in a prior art, an epitaxial structure of a GaN-based light-emitting diode usually includes an n-type GaN layer 01, a low-temperature insertion layer 02 (a low-temperature gallium nitride layer and/or a first super-lattice structure), a second superlattice structure 03, a light-emitting layer 04, and a p-type GaN layer 05. The second superlattice structure 03 includes an InGaN layer, which has a relatively lower indium (In) content than that of an InGaN layer of the light-emitting layer 04, and therefore can exhibit a significant stress-buffering effect and enhance growth quality of crystals. Moreover, by having the low-temperature insertion layer 02 that contains nitrides (a low-temperature gallium nitride layer and/or a first superlattice structure) therein, the growth stress of the light-emitting layer 04 made of quantum wells is effectively reduced, the crystal quality thereof 04 is improved, and V-shaped defects (V-pits) 030 can be gradually induced to open.

Currently in the technology of white-light lighting, the low-temperature insertion layer 02 commonly has a greater thickness that exceeds 400 nm and a higher carbon (C) content that exceeds $5 \times 10^{17}$ atoms/cm$^3$. This realizes the desire that most of the V-pits 030 are opened in the subsequently formed second superlattice structure 03, so that a bottom surface of the V-pits 030 is located beneath the light-emitting layer 04, and the width of V-pit inclined sidewalls in quantum wells is narrow, thereby suppressing non-radiative recombination as well as elevating internal quantum efficiency.

However, the configuration of the foregoing technology is merely suitable for a product having a capacity of receiving a medium to large current density (>20 A/cm$^2$). For a product receiving merely a lower current density, these surface defects (i.e., the V-pits 030) will form into a current leakage channel, which may reduce luminous efficiency of a light-emitting diode (LED). In order to solve the problems described above, the disclosure provides an epitaxial structure of a semiconductor light-emitting element, a semiconductor light-emitting element and a light-emitting device including the afore-mentioned epitaxial structure, which will be described in detail with reference to the following embodiments and drawings.

Embodiment 1

Figure 2:
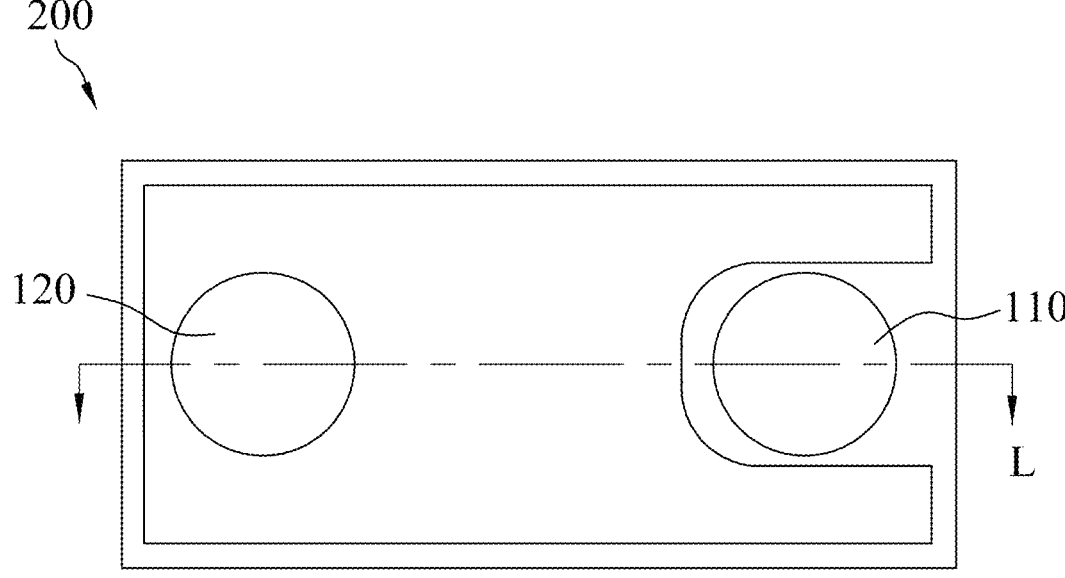
FIG. 2 is a top schematic view of a semiconductor light-emitting element of Embodiment 1 according to the disclosure.
Figure 3:
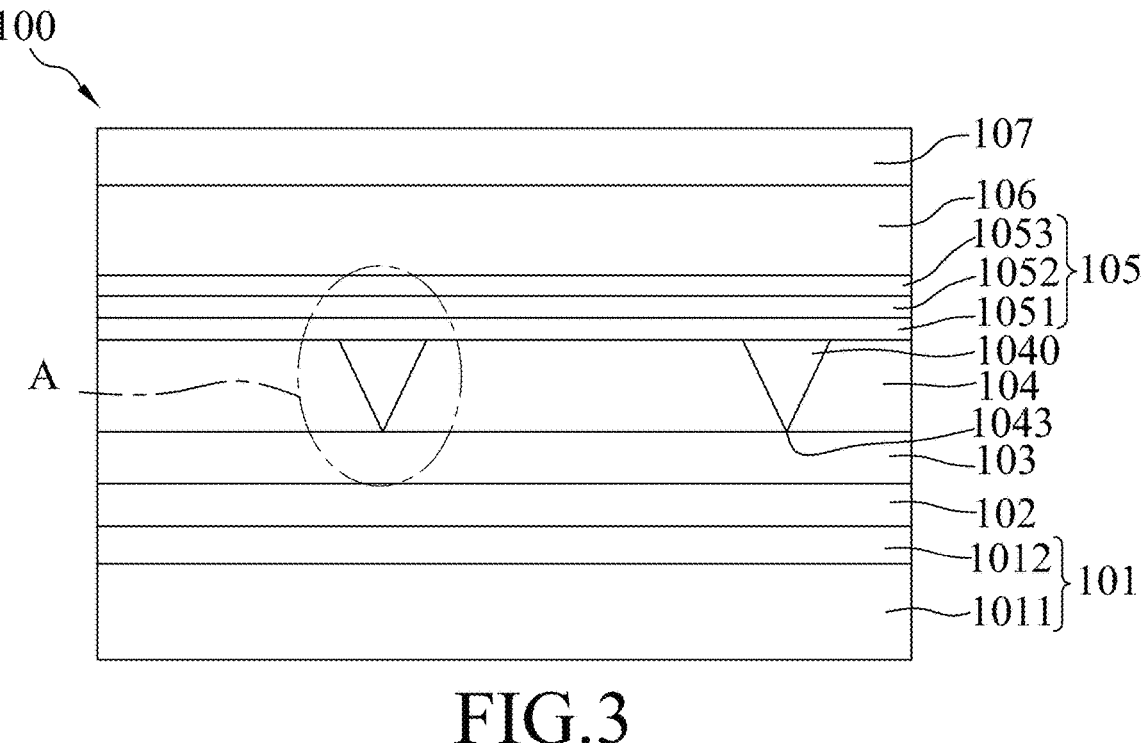
FIG. 3 a vertical sectional view along the line L-L in FIG. 2 illustrating an epitaxial structure of Embodiment 1 according to the disclosure.

Referring to FIGS. 2 and 3, in this embodiment, a semiconductor light-emitting element 200 (briefly named as light-emitting diode (LED) and abbreviated as "LED" hereinafter) is provided. The LED 200 includes an epitaxial structure 100, and there are a first electrode 110 and a second electrode 120 formed on the epitaxial structure 100.

In certain embodiments, the LED 200 may be a front-mounted LED or a flip-chip LED, and can be driven with a low current density such as a current density less than 20 A/cm$^2$. The LED 200 may also be a small-sized chip in which at least one side thereof has a length (e.g., a side length) less than 300 μm. The LED 200 can be used as a light source for a red/green/blue (RGB) direct display or for a backlight display.

In an exemplary embodiment, the epitaxial structure 100 of the LED 200 is an AlGaInN-based epitaxial structure. Referring to FIG. 3 as an example, the epitaxial structure 100 includes an n-type layer 101, a V-pit control layer 102, a second superlattice layer 103, and a light-emitting layer 104 which are sequentially stacked in such order from bottom up. A p-type layer 106 is disposed on the light-emitting layer 104. Additionally, the n-type layer 101 includes an n-type electron injection layer 1011 and an n-type current spreading layer 1012. The V-pit control layer 102 includes a first superlattice layer 1023. Each of the first superlattice layer 1023 and the light-emitting layer 104 is an indium (In)-containing layer.

In this embodiment, the n-type electron injection layer 1011 is an n-type GaN layer and is used to provide electrons by doping with an n-type impurity which may be, for instance, silicon (Si), germanium (Ge), tin (Sn), selenium (Se), or tellurium (Te). In this embodiment, the n-type impurity is Si. The n-type electron injection layer 1011 has a thickness ranging from 1 μm to 4 μm, and a doping concentration ranging from $1 \times 10^{19}$ atoms/cm$^3$ to $1 \times 10^{20}$ atoms/cm$^3$ so as to provide electrons for radiative recombination. In addition, the n-type electron injection layer 1011 has the highest n-type doping concentration among all layers in the epitaxial structure 100, and can be a single-layer structure or a superlattice structure (e.g., GaN layers with two different doping concentrations alternately stacked). The electron injection layer 1011 is not only configured for injecting electrons but also used to serve as a contact layer, so it requires high doping to reduce contact resistance.

In some embodiments, a radiation light that the epitaxial structure 100 emits is blue light or green light.

Figure 6:
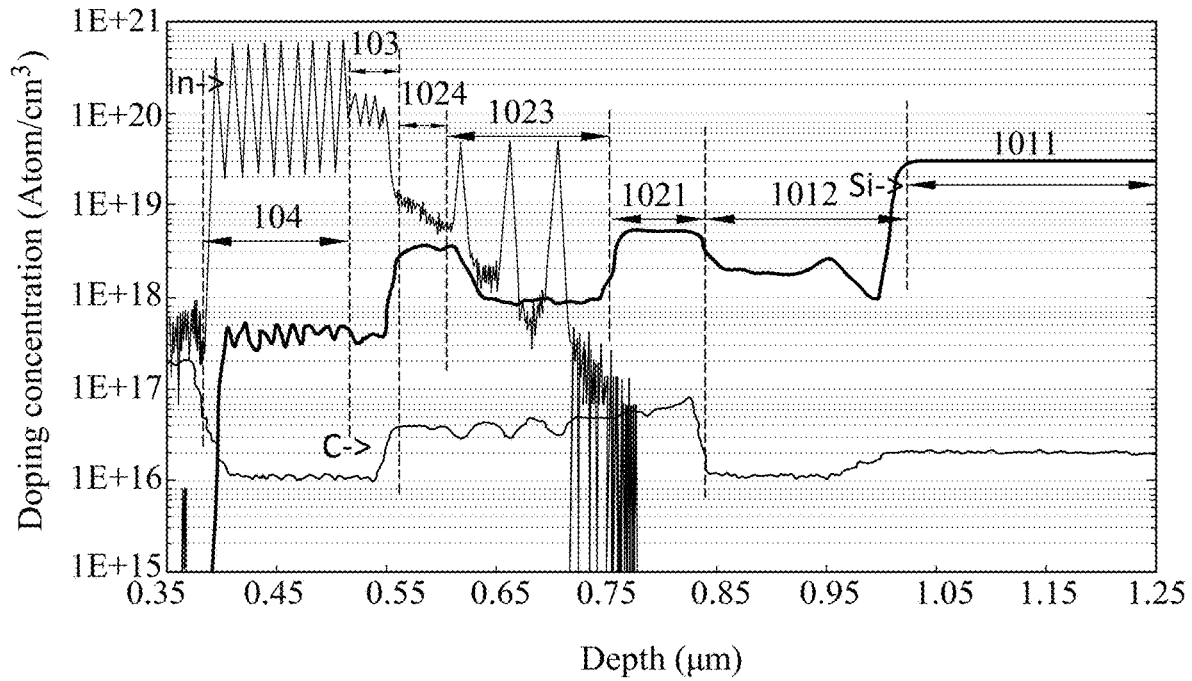
FIG. 6 shows relationship between the doping concentration and the depth for each layer of the epitaxial structure of Embodiment 1.

The n-type current spreading layer 1012 is grown upon the electron injection layer 1011, which can enhance lateral current spread. The current spreading layer 1012 is an n-type doping layer having a relatively low n-type doping concentration. Moreover, the current spreading layer 1012 has a Si doping concentration ranging from $1 \times 10^{17}$ atoms/cm$^3$ to $2 \times 10^{18}$ atoms/cm$^3$ which is lower than a Si doping concentration of the electron injection layer 1011. The current spreading layer 1012 helps current to spread laterally. The current spreading layer 1012 has a thickness less than or equal to 0.3 μm. In an exemplary embodiment, the thickness is greater than or equal to 0.01 μm. An excessive thickness thereof may cause an increase in voltage. Referring to FIG. 6, the current spreading layer 1012 is located from a depth of 0.85 μm to a depth of 1.03 μm. Furthermore, the growth temperature of each of the electron injection layer 1011 of n-type and the current spreading layer 1012 of n-type is not less than 1000° C.

The current spreading layer 1012 has a carbon (C) doping concentration less than a C doping concentration of the V-pit control layer 102. In an exemplary embodiment, the C doping concentration of the current spreading layer 1012 is less than $2 \times 10^{16}$ atoms/cm$^3$.

The V-pit control layer 102 is disposed on the current spreading layer 1012, specifically, disposed (formed) between the current spreading layer 1012 and the light-emitting layer 104 for controlling and inducing V-pits 1040 shown in FIG. 3, to open in the light-emitting layer 104 so as to release stresses. The V-pit control layer 102 at least includes the first superlattice layer 1023 having a certain thickness and containing indium (In). While improving the crystal quality of the light-emitting layer 104, the V-pit control layer 102 enables the dislocation defects of a GaN layer to gradually open so as to form the V-pits 1040.

Referring to FIG. 3, this embodiment enables reduction of leakage channels, and increases radiative recombination ratio under a low current density for enhancing luminous efficiency. By controlling the compositions of the V-pit control layer 102, shortening the distance between the V-pit control layer 102 and the light-emitting layer 104, and optimizing the thickness of the V-pit control layer 102, most or even all of tips 1043 of the V-pits 1040 can be located not lower than a bottom surface of an initial well layer 1041 of the light-emitting layer 104, or even higher than the foregoing bottom surface of the initial well layer 1041.

The V-pit control layer 102 is multilayered and may at least include a gallium nitride (GaN) layer. The first superlattice layer 1023 is also included therein. The first superlattice layer 1023 is an In-containing layer. The V-pit control layer 102 may also at least include a GaN layer and an InGaN layer, or may include a group of GaN and InGaN layers.

Moreover, a distance between a bottom surface of the V-pit control layer 102 and a bottom surface of the first superlattice layer 1023 is less than or equal to 0.15 μm. Furthermore, the bottom surface of the first superlattice layer 1023 and the bottom surface of the light-emitting layer 104 have a distance therebetween ranging from 0.05 μm to 0.3 μm.

The C doping concentration of the V-pit control layer 102 is greater than or equal to $2\times10^{16}$ atoms/cm$^3$ and less than or equal to $5\times10^{17}$ atoms/cm$^3$, and is greater than a C doping concentration of the n-type layer 101. In other embodiments, the C doping concentration of the V-pit control layer 102 is greater than or equal to $2\times10^{16}$ atoms/cm$^3$ and less than or equal to $8\times10^{16}$ atoms/cm$^3$. In still other embodiments, the C doping concentration of the V-pit control layer 102 is greater than or equal to $3\times10^{16}$ atoms/cm$^3$ and less than or equal to $8\times10^{16}$ atoms/cm$^3$. In yet other embodiments, the C doping concentration of the V-pit control layer 102 is greater than or equal to $3\times10^{16}$ atoms/cm$^3$ and less than or equal to $5\times10^{16}$ atoms/cm$^3$.

The V-pit control layer 102 is disposed on the n-type layer 101. By having a relatively low C-doping concentration, surface defects in the n-type GaN layer can be induced to open at a low speed so as to form into V pits (defects), realizing the desire that openings of the V pits can be located in the light-emitting layer 104 and uniformly distributed.

In certain embodiments, the V-pit control layer 102 has a silicon (Si) concentration ranging from $1\times10^{17}$ atoms/cm$^3$ to $1\times10^{19}$ atoms/cm$^3$, and can be obtained with a procedure having a growth temperature ranging from 800° C. to 900° C.

In certain embodiments, the V-pit control layer 102 has a thickness less than or equal to 0.4 μm. In certain embodiments, the V-pit control layer 102 further includes a first layer structure 1021 disposed on the current spreading layer 1012. A bottom surface of the first layer structure 1021 is the bottom surface of the V-pit control layer 102. The first layer structure 1021 may be an InGaN layer having an indium concentration lower than an indium concentration of each of In-containing layers of the first superlattice layer 1023, or may be a GaN layer.

In some embodiments, first layer structure 1021 is an n-type doped GaN layer. The first layer structure 1021 has a Si doping concentration ranging from $2\times10^{18}$ atoms/cm$^3$ to $1\times10^{19}$ atoms/cm$^3$. In some embodiments, the Si doping concentration of the first layer structure 1021 ranges from $4\times10^{18}$ atoms/cm$^3$ to $7\times10^{18}$ atoms/cm$^3$. For producing the first layer structure 1021, a procedure having a growth temperature ranging from 800° C. to 900° C. may be adopted.

The bottom surface of the V-pit control layer 102 may be the bottom surface of the first layer structure 1021. In other embodiments, the Si doping concentration of the first layer structure 1021 is relatively high, precisely speaking, higher than the Si doping concentration of the current spreading layer 1012. The first layer structure 1021 has the functions of the V-pit control layer 102. In addition, due to the higher Si doping concentration, the first layer structure 1021 also possesses an anti-static damage ability, and an ability to adjust the electrostatic discharge (ESD) in an light-emitting element, thereby ensuring a high reliability of the light-emitting element when being applied in a backlighting or display apparatus. In other embodiments, the first layer structure 1021 has a Si doping concentration ranging from $2\times10^{18}$ atoms/cm$^3$ to $1\times10^{19}$ atoms/cm$^3$.

The Si doping concentration of the first layer structure 1021 is greater than a Si doping concentration of a top surface of the n-type layer 101. In this embodiment, the Si doping concentration of the first layer structure 1021 is greater than a Si doping concentration of a top surface of the current spreading layer 1012 but less than the Si doping concentration of the electron injection layer 1011 of n-type.

The first layer structure 1021 requires a certain thickness. In some embodiments, the first layer structure 1021 has a thickness less than or equal to 0.15 μm and greater than or equal to 0.02 μm. In still some embodiments, the first layer structure 1021 has a thickness ranging from 0.05 μm to 0.10 μm.

Referring to FIG. 6, the first layer structure 1021 is located from a depth of 0.75 μm to a depth of 0.85 μm.

In certain embodiments, the current spreading layer 1012 has the thickness greater than the thickness of the first layer structure 1021, and has the Si doping concentration less than the Si doping concentration of the first layer structure 1021. That is to say, the thickness of the current spreading layer 1012 is greater than the distance between the bottom surface of the V-pit control layer 102 and the bottom surface of the first superlattice layer 1023, so that the appeal for allowing the current spreading effect to act underneath the V-pit control layer 102, the bottom surface of the V-pit control layer 102 to be closer to the light-emitting layer 104, and the openings of the V-shaped pits to be located within the light-emitting layer 104 can therefore be satisfied.

In addition to the first layer structure 1021, the V-pit control layer 102 also includes the first superlattice layer 1023 as already mentioned before. When the electron injection layer 1011 is the n-type GaN layer, the InGaN-containing light-emitting layer 104 grown on the n-type GaN layer can produce stresses due to differences in lattice parameters. The first superlattice layer 1023 is utilized to relieve such stresses to thereby enhance crystals growth quality as well as luminous brightness of a nitride-based light-emitting diode.

In some embodiments, each period of the first superlattice layer 1023 of the V-pit control layer 102 has stacked layers of $In_xGa_{1-x}N/In_yGa_{1-y}N$, where x>y, 0<x<1, and 0≤y<1. From bottom to top of the first superlattice layer 1023, an initial layer of the first superlattice layer 1023 is an $In_yGa_{1-y}N$ layer, and a terminal layer of the first superlattice layer 1023 is an $In_xGa_{1-x}N$ layer, or an initial layer of the first superlattice layer 1023 is an $In_xGa_{1-x}N$ layer, and a terminal layer of the first superlattice layer 1023 is an $In_yGa_{1-y}N$ layer. In this embodiment, each period of the first superlattice layer 1023 has stacked layers of InGaN/GaN, an initial layer of the first superlattice layer 1023 is a GaN layer, and a terminal layer of the first superlattice layer 1023 is an InGaN layer. In addition, the first superlattice layer 1023 has 3 to 7 periods (i.e., 3 to 7 pairs of stacked layers of InGaN/GaN. The first superlattice layer 1023 also has Si doping, and it can be seen from FIG. 6 that the first superlattice layer 1023 has a Si doping concentration ranging from $5 \times 10^{17}$ atoms/cm$^3$ to $2 \times 10^{18}$ atoms/cm$^3$. Furthermore, the first superlattice layer 1023 has a total thickness ranging from 0.05 µm to 0.3 µm. In some embodiments, the total thickness of the first superlattice layer 1023 ranges from 0.05 µm to 0.2 µm, for example, from 0.05 µm to 0.15 µm. As shown in FIG. 6, the first superlative layer 1023 is located within a range of depth from 0.6 µm to 0.75 µm.

The bottom surface of the first superlattice layer 1023 may be a bottom surface of an initial layer of the first superlattice layer 1023.

Figure 4:
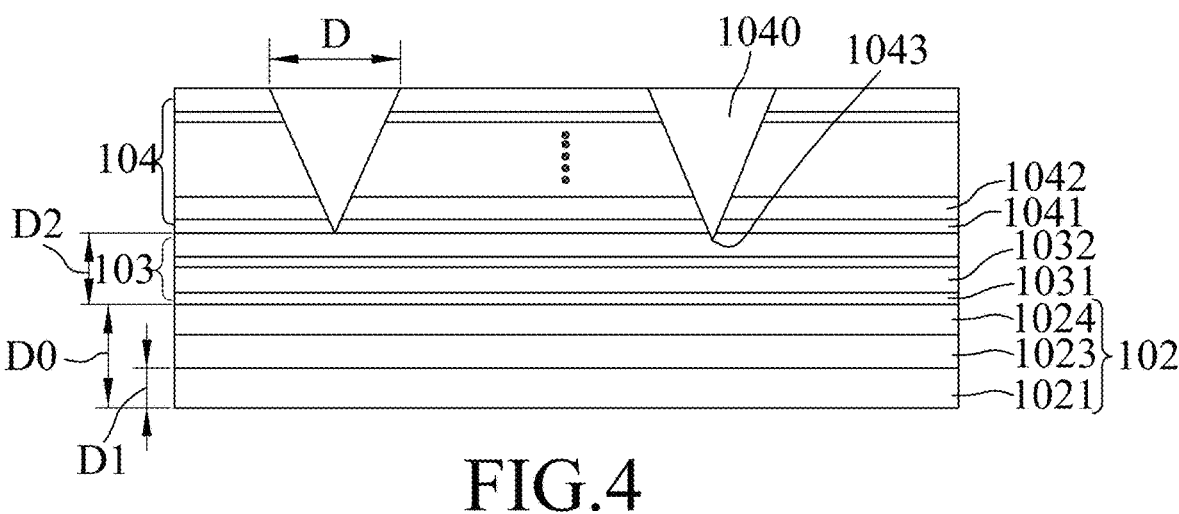
FIG. 4 is an enlarged schematic view of region "A" of the epitaxial structure of Embodiment 1.
Figure 5:
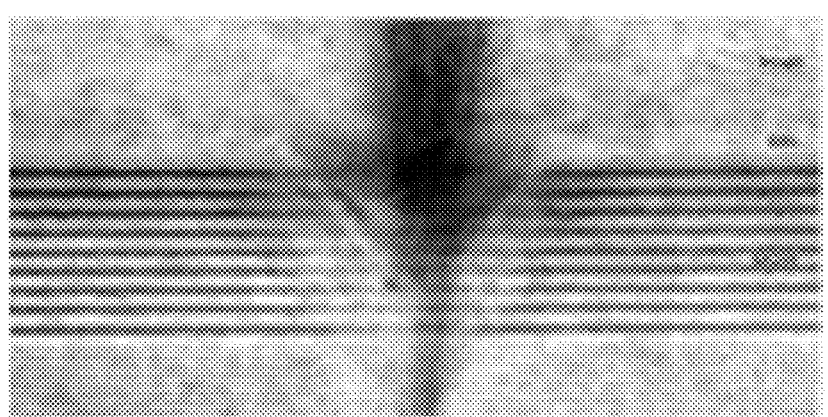
FIG. 5 is a transmission electron microscope (TEM) image of the epitaxial structure of Embodiment 1.

Referring to FIG. 4, in certain embodiments, the V-pit control layer 102 further includes a third layer structure 1024 disposed above the first superlattice layer 1023 and below the light-emitting layer 104. The third layer structure 1024 has a high silicon doping concentration. The first layer structure 1021 and the third layer structure 1024 are located respectively at two opposite sides of the first superlattice layer 1023, and cooperatively provide the effects of preventing electrostatic damages, adjusting the electrostatic discharge (ESD) in an light-emitting element, thereby ensuring a high reliability of the light-emitting element when being applied in a backlighting or display apparatus.

The third layer structure 1024 may be an InGaN layer or a GaN layer, and the InGaN layer has an In content less than an In content of each of the In-containing layers of the first superlattice layer 1023. The third layer structure 1024 is disposed on the first superlattice layer 1023. The third layer structure 1024 has a thickness ranging from 0.01 µm to 0.1 µm, for example, from 0.03 µm to 0.08 µm. Referring to FIG. 6 again, the third layer structure 1024 is located within a range of depth from 0.55 µm to 0.6 µm. The third layer structure 1024 has a Si doping concentration greater than the Si doping concentration of the first superlattice layer 1023. In addition, the Si doping concentration of the third layer structure 1024 ranges from $1 \times 10^{18}$ atoms/cm$^3$ to $1 \times 10^{19}$ atoms/cm$^3$, for example, from $2 \times 10^{18}$ atoms/cm$^3$ to $5 \times 10^{18}$ atoms/cm$^3$. Additionally, the thickness of the third layer structure 1024 is greater than a thickness of each of In$_y$Ga$_{1-y}$N layers of the first superlattice layer 1023.

In certain embodiments, each period of the first superlattice layer 1023 has stacked layers of In$_x$Ga$_{1-x}$N/In$_y$Ga$_{1-y}$N, where x>y, 0<x<1, and 0≤y<1. In addition, the thickness of the third layer structure 1024 is greater than the thickness of each In$_y$Ga$_{1-y}$N layer of the first superlattice layer 1023, and an initial layer is one of the In$_y$Ga$_{1-y}$N layers and a terminal layer is one of the In$_x$Ga$_{1-x}$N sublayers.

In certain embodiments, the third layer structure 1024 is a terminal layer of the first superlattice layer 1023, and the first superlative layer 1023 has stacked layers of In$_x$Ga$_{1-x}$N/In$_y$Ga$_{1-y}$N, in which an initial layer thereof is an In$_x$Ga$_{1-x}$N layer and a terminal layer thereof is an In$_y$Ga$_{1-y}$N layer, where x>y, 0<x<1, and 0≤y<1. In this case, the third layer structure 1024 is the In$_y$Ga$_{1-y}$N layer of the first superlattice layer 1023, for example, a GaN layer. The thickness of the third layer structure 1024 ranges from 0.01 µm to 0.1 µm. The Si doping concentration of the third layer structure 1024 is greater than the Si doping concentration of the first superlattice layer 1023. Moreover, the Si doping concentration of the third layer structure 1024 ranges from $1 \times 10^{18}$ atoms/cm$^3$ to $1 \times 10^{19}$ atoms/cm$^3$. The thickness of the third layer structure 1024 is greater than a thickness of each of other sublayers of the first superlattice layer 1023.

The third layer structure 1024 has a high silicon doping concentration. The third and first layer structure 1024 and 1021 are located at two sides of the first superlattice layer 1023 and cooperatively provide an effect of preventing electrostatic damage, adjusting the electrostatic discharge (ESD) performance in an light-emitting element, thereby ensuring a high reliability of the light-emitting element when being applied in a backlighting or display apparatus.

Referring to FIG. 3, the epitaxial structure 100, in other embodiments, may further includes a second superlattice layer 103 disposed on the V-pit control layer 102. The second superlattice layer 103 has stacked layers of In$_m$Ga$_{1-m}$N/In$_n$Ga$_{1-n}$N; an initial layer of the second superlattice layer 103 is an In$_m$Ga$_{1-m}$N layer, and a terminal of the second superlattice layer 103 is an In$_n$Ga$_{1-n}$N layer, where m>n, 0<m<1, and 0≤n<1. The second superlattice layer 103 is disposed above the third layer structure 1024 of the V-pit control layer 102 and below the light-emitting layer 104. In other words, the second superlattice layer 103 is disposed between the V-pit control layer 102 and the light-emitting layer 104. The first superlattice layer 1023 and the second superlattice layer 103 can cooperate together to relieve stress generated in a situation where the InGaN-containing light-emitting layer 104 is grown above the GaN-containing n-type electron injection layer 1011, and to thereby elevate growth quality of crystals and improve luminous brightness of a light-emitting diode.

In some embodiments, the second superlattice layer 103 has a C doping concentration less than or equal to the C doping concentration of the V-pit control layer 102. As shown in FIG. 6, in an embodiment, the C doping concentration of the second superlattice layer 103 is less than a C doping concentration of the first superlattice layer 103. The C doping concentration of the second superlattice layer 103 may be less than $2 \times 10^{16}$ atoms/cm$^3$.

In other embodiments, an In content of the In$_m$Ga$_{1-m}$N layer of the second superlattice layer 103 is greater than or equal to an In content of the In$_x$Ga$_{1-x}$N layer of the first superlattice layer 1023. In this embodiment, the In content of the In$_m$Ga$_{1-m}$N layer of the second superlattice layer 103 is greater than the In content of the In$_x$Ga$_{1-x}$N sublayer of the first superlattice layer 1023. In some embodiments, the second superlattice layer 103 has a smaller thickness, and hence the thickness of the first superlattice layer 1023 is greater than a thickness of the second superlattice layer 103. Accordingly, the V-pit control layer 102 is closer to the light-emitting layer 104, most V pits 1040 are opened within the light-emitting layer 104, at least most bottoms of the V-pits 1040 are located within the light-emitting layer 104, and the second superlattice layer 103 can achieve a stress relief effect.

Referring to FIG. 4, in this embodiment, the second superlattice layer 103 is a periodic superlattice structure having alternately stacked narrow bandgap sublayers 1031 and a wide bandgap sublayers 1032. In addition, a period number of the second superlattice layer 103 (i.e., the periodic superlattice structure) may range from 3 to 5. In this embodiment, the period number of the second superlattice layer 103 is 4. In certain embodiments, the narrow bandgap sublayers 1031 of the second superlattice layer 103 may be InGaN sublayers, and the wide bandgap sublayers 1032 of the second superlattice layer 103 may be GaN sublayers, and an initial layer of the second superlattice layer 103 is one of the InGaN sublayers and a terminal layer of the second superlattice layer 103 is one of the GaN sublayers. The second superlattice layer 103 has a Si doping concentration ranging from $1\times10^{17}$ atoms/cm$^3$ to $1\times10^{18}$ atoms/cm$^3$. The thickness (D2) of the second superlattice layer 103 is constrained not to be greater than 0.1 μm. In some embodiments, the thickness (D2) of the second superlattice layer 103 is greater than or equal to 0.02 μm and less than or equal to 0.08 μm. Referring to FIG. 6, the position of the second superlattice layer 103 falls within a range of depth from 0.51 μm to a depth of 0.55 μm. In the second superlattice layer 103, the initial layer is one of the narrow bandgap sublayers 1031, e.g., an InGaN sublayer, and the terminal layer is one of the wide bandgap sublayer 1032, e.g., a GaN sublayer.

The light-emitting layer 104 is formed above the second superlattice layer 103, and is a region where electrons and holes recombine for light radiation. Selection of materials of the light-emitting layer 104 depends on a desire wavelength of an emitting light. The light-emitting layer 104 may be a single quantum well including a well layer and a barrier layer, or may be a periodic structure of multiple quantum wells in which well layers and barrier layers are alternately stacked. By adjusting the composition ratio of semiconductor materials of the light-emitting layer 104, various wavelengths of lights may be obtained. In some embodiments, the light-emitting layer 104 is a periodic structure of multiple quantum wells where each period has stacked layers of InGaN/GaN, and a period number thereof may range from 5 to 15. In other embodiments, the light-emitting layer 104 has 5 to 15 periods of stacked layers of InGaN/AlGaN, and an initial layer of the light-emitting layer 104 is a well layer 1041 and a terminal layer of the light-emitting layer 104 is a barrier layer 1042. Each of the barrier layers 1042 of the light-emitting layer 104 has a Si doping concentration ranging from $1\times10^{17}$ atoms/cm$^3$ to $1\times10^{18}$ atoms/cm$^3$. In addition, in each period of the light-emitting layer 104, the InGaN layer has a thickness ranging from 1 nm to 4 nm, and the GaN layer has a thickness ranging from 3 nm to 20 nm. In other embodiments, each of the barrier layers 1042 of the light-emitting layer 104 may be doped with a small amount of aluminum (Al) and therefore is an AlGaN material. Referring to FIG. 4, in this embodiment, the light-emitting layer 104 is a periodic structure of multiple quantum wells formed by alternate In$_{x2}$Ga$_{(1-x2)}$N well layers 1041 and Al$_{y2}$Ga$_{(1-y2)}$N barrier layers 1042, where $0.08\leq x2\leq0.18$, $0.02\leq y2\leq0.08$. The well layers 1041 have a bandgap energy less than a bandgap energy of the barrier layers 1042.

Each In-containing layer of the light-emitting layer 104 has an In content greater than an In content of each In-containing layer of the second superlattice layer 103.

Referring to FIG. 4, in this embodiment, in order to achieve the purpose of reducing leakage channels, the radiative recombination ratio under a low current density needs to be increased so as to enhance luminous efficiency. By shortening the distance between the V-pit control layer 102 and the light-emitting layer 104 so that the bottom surface of the V-pit control layer 102 and the bottom surface of the light-emitting layer 104 come closer, and by making thinner the thickness of the V-pit control layer 102, most or even all of the tips 1043 of the V-pits 1040 can be located not below or even above the initial well layer 1041, i.e., a first In-containing layer of the light-emitting layer 104.

The growth temperature of the V-pit control layer 102 is lower than the growth temperature of the current spreading layer 1012 and the n-type layer 101 so that the dislocation defects can be gradually induced to open and to thereby form into the V-pits 1040.

In some embodiments, the growth temperature of the V-pit control layer 102 ranges from 800° C. to 900° C.

In other embodiments, the V-pit control layer 102 is made at a lower temperature, and to be more specific, the growth temperature of the V-pit control layer 102 is lower than the growth temperatures of the current spreading layer 1012, the second superlattice layer 103 and the light-emitting layer 104. Moreover, the C doping concentration of the V-pit control layer 102 is greater than the C doping concentration of the current spreading layer 1012 and a C doping concentration of the electron injection layer 1011.

In other embodiments, the V-pit control layer 102 is doped with silicon.

The V-pit control layer 102 includes the first superlattice layer 1023, which contains indium, that is, the In-containing layer as descried above. By doping with indium, the stress generated during the growth of the epitaxial structure 100 can be alleviated and released, the V-pits 1040 can be induced to gradually open in subsequent growing layers, and the second superlattice layer 103 can be cooperative with the first superlattice layer 1023.

In addition, the V-pit control layer 102 further includes the first layer structure 1021 disposed below the first superlattice layer 1023. Specifically, the first layer structure 1021 is disposed between the first superlattice layer 1023 and the n-type current spreading layer 1012. The Si doping concentration of the first layer structure 1021 ranges from $2\times10^{18}$ atoms/cm$^3$ to $1\times10^{19}$ atoms/cm$^3$, which is greater than the Si doping concentration of the first superlattice layer 1023 and the Si doping concentration of the current spreading layer 1012.

The first layer structure 1021 serves to relieve stress for inducing opening of the V-pits 1040, and has a relatively high Si doping concentration for enhancement of ESD performance of a light-emitting element under a small current density in a backlighting display or a red/green/blue (RGB) display. Combining the two foregoing effects in a same layer, the epitaxial structure 100 can be made thinner, and most of the tips 1043 of the V-pits 1040 can be located within the light-emitting layer 104, thereby reducing leakage channels and enhancing luminous efficiency of the LED 200.

The V-pit control layer 102 further includes a third layer structure 1024, which can assist the first layer structure 1021 in relieving stress for inducing opening of the V-pits 1040. In addition, the third layer structure 1024 has a greater Si doping concentration and a greater thickness and thus can improve the ESD performance of a light-emitting element applied in a backlighting display or a red/green/blue (RGB) display under a small current density. The Si doping concentration of the third layer structure 1024 may be slightly lower than the Si doping concentration of the first layer structure 1021 but higher than the Si doping concentration of the first superlattice layer 1023.

When the first layer structure 1021 and the third layer structure 1024 are GaN layers, and each period of the first superlattice layer 1023 are stacked layers of InGaN/GaN, the thickness of the third layer structure 1024 shall be greater than a thickness of a GaN layer of each period of the first superlattice layer 1023.

For manufacturing the first layer structure 1021, the first superlattice structure 1023, and the third layer structure 1024, in some embodiments, a growth temperature of the third layer structure 1024 may be equal to a growth temperature of the first superlattice layer 1023, and a C doping concentration of the third layer structure 1024 may be equal to a C doping concentration of the first superlattice layer 1023. In other embodiments, a growth temperature of the third layer structure 1024 may be higher than a growth temperature of the first superlattice layer 1023, and a C doping concentration of the third layer structure 1024 is lower than a C doping concentration of the first superlattice layer 1023. Additionally, each of a growth temperature of the second superlattice layer 103 and a growth temperature of the light-emitting layer 104 is higher than a growth temperature of the V-pit control layer 102, and a C doping concentration of the second superlattice layer 103 is lower than a C doping concentration of the V-pit control layer 102. The C doping concentration of the second superlattice layer 103 is lower than $2 \times 10^{16}$ atoms/cm$^3$. In an exemplary embodiment, a growth temperature of each of the first layer structure 1021, the first superlattice layer 1023, and the third layer structure 1024 ranges from 800° C. to 900° C.

Referring to FIG. 4, each V-pit surface 1040 may have a pyramidal shape, such as a hexagonal pyramidal shape. An opening width (D) of the V-pit 1040 is the largest width of the opening of the hexagonal pyramidal V-pit measured at a topmost surface of the light-emitting layer 104. In addition, the location of the tip 1043 of the V-pit 1040 is the location of the tip of the hexagonal pyramidal pit. By controlling the V-pits 1040 as described hereinbefore, most or even all of the tips 1043 of the V-pits 1040 can be located within the light-emitting layer 104, leakage channels can be reduced, and the luminous efficiency of the LED 200 can be improved.

Referring to FIG. 4, the thickness (D0) of the V-pit control layer 102 is not greater than 400 nm. In some embodiments, the thickness (D0) of the V-pit control layer 102 ranges from 150 nm to 350 nm. The V-pit control layer 102 includes the first superlattice layer 1023, and a distance between the bottom surface of the V-pit control layer 102 and the bottom surface of the first superlattice layer 1023 is D1. In this embodiment, as shown in FIG. 4, D1 is the thickness of the first layer structure 1021 and is controlled to be less than or equal to 150 nm (0.15 μm). In some embodiments, the distance (D1) therebetween is less than or equal to 100 nm. In other embodiments, the distance (D1) therebetween is less than or equal to 50 nm.

Referring to FIG. 3, the p-type layer 106 is disposed above the light-emitting layer 104, and is a p-type GaN layer 106. The p-type layer 106 provides holes by doping with a p-type impurity, such as magnesium (Mg), zinc (Zn), calcium (Ca), strontium (Sr), or barium (Ba). In this embodiment, the p-type impurity is Mg. In addition, a p-type ohmic contact layer 107 is disposed above the p-type layer 106, and through high doping, for instance, a doping concentration greater than $1 \times 10^{20}$ atoms/cm$^3$, the p-type layer 106 can form an ohmic contact with a subsequently formed p-type electrode of a nitride-based light-emitting diode. For achieving the purposes of filling up the V-pits and hence alleviating a micro pitting phenomenon in the surface of the epitaxial structure 100, in certain embodiments, the p-type GaN layer 106 may have a thickness greater than or equal to 100 nm; in certain embodiments, the thickness of the p-type GaN layer 106 may be greater than or equal to 100 nm and less than or equal to 300 nm, so as to satisfy the foregoing purposes, thereby enhancing the reliability of the nitride-based light-emitting diode.

In order to prevent electrons from overflowing, an electron blocking layer 105 is further formed between the p-type layer 106 and the light-emitting layer 104. The electron blocking layer 105 may be an $Al_aIn_bGa_{(1-a-b)}N$ layer, where $0 < a \leq 1$, and $0 \leq b < 1$. Referring to FIG. 3, in some embodiments, the $Al_aIn_bGa_{(1-a-b)}N$ layer of the electron blocking layer 105 may include a first sublayer 1051, a second sublayer 1052 and a third sublayer 1053 which are stacked from bottom to top. The third sublayer 1053 has an In content greater than an In content of each of the first sublayer 1051 and the second sublayer 1052. The In content of the second sublayer 1052 may be less than the In content of the first sublayer 1051, or may be greater than the In content of the first sublayer 1051. Moreover, the first sublayer 1051 has an aluminum (Al) content greater than an Al content of the second sublayer 1052, and the third sublayer 1053 has an Al content greater than the Al content of the second sublayer 1052.

The first sublayer 1051 is formed after formation of the light-emitting layer 104, and may provide a function for electron blocking. The first sublayer 1051 may be made of a material selected from the group consisting of AlN, AlGaN, AlInGaN, and combinations thereof.

The second sublayer 1052 is disposed between the first sublayer 1051 and the third sublayer 1053, has the In content less than the In content of each of the first sublayer 1051 and the third sublayer 1053, and may be made of a material selected from the group consisting of AlGaN, GaN, AlInGaN, and combinations thereof. The second sublayer 1052 is a hole injection layer, and may have a thickness ranging from 3 nm to 70 nm. In some embodiments, the thickness of the second sublayer 1052 may be greater than or equal to 8 nm and less than or equal to 70 nm. In still some embodiments, the thickness of the second sublayer 1052 may range from 10 nm to 50 nm. In addition, the second sublayer 1052 has a p-type doping concentration greater than or equal to $1 \times 10^{19}$ atoms/cm$^3$. In other embodiments, the p-type doping concentration of the second sublayer 1052 is greater than or equal to $5 \times 10^{19}$ atoms/cm$^3$. In still other embodiments, the p-type doping concentration of the second sublayer 1052 ranges from $1 \times 10^{20}$ atoms/cm$^3$ to $2 \times 10^{20}$ atoms/cm$^3$. By increasing p-type doping concentration of the second sublayer 1052, the hole injection efficiency thereof may be improved.

The third sublayer 1053 may be made of a material selected from the group consisting of AlN, AlGaN, AlInGaN, and combinations thereof, and may provide a function for electron blocking.

Embodiment 2

In this embodiment, a top surface of the V-pit control layer 102 is in contact with the bottom surface of the light-emitting layer 104, and such configuration can fulfill the request that most or even all of the V-pits 1040 are opened in the light-emitting layer 104, thereby preventing electrical leakage.

Figure 7:
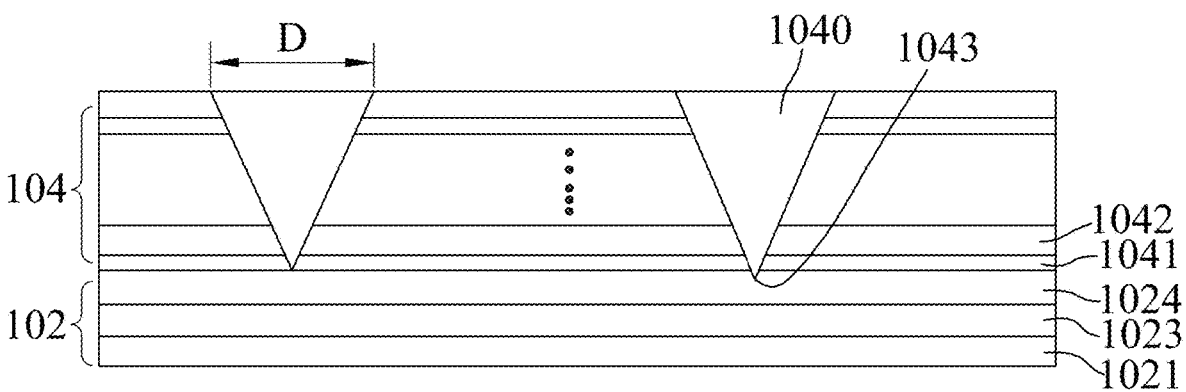
FIG. 7 is another enlarged schematic view which is the same view as FIG. 4 but showing an epitaxial structure of Embodiment 2 according to the disclosure.

Referring to FIG. 7, the V-pit control layer 102 includes the first layer structure 1021, the first superlattice layer 1023, and the third layer structure 1024. A top surface of the third layer structure 1024 is in contact with the bottom surface of the light-emitting layer 104.

The first layer structure 1021 of the V-pit control layer 102 is closer to the current spreading layer 1012, and is an n-type doped GaN layer. The Si doping concentration of the first layer structure 1021 ranges from $2 \times 10^{18}$ atoms/cm$^3$ to $1 \times 10^{19}$ atoms/cm$^3$. For manufacturing the first layer structure 1021, the growth temperature ranging from 800° C. to 900° C. may be adopted.

In some embodiments, the first layer structure 1021 has a relatively high Si doping concentration, and strictly speaking, the Si doping concentration thereof is greater than the Si doping concentration of the current spreading layer 1012. Such high Si doping concentration in the first layer structure 1021 can prevent electrostatic damage, adjust the electrostatic discharge (ESD) performance of a light-emitting element, and ensure high reliability of the light-emitting element when being applied in a backlighting or display apparatus.

The Si doping concentration of the first layer structure 1021 is greater than the Si doping concentration of the top surface of the n-type layer 101. In this embodiment, the Si doping concentration of the first layer structure 1021 is greater than the Si doping concentration of the top surface of the current spreading layer 1012.

In certain embodiment, the first layer structure 1021 has the thickness less than or equal to 0.15 μm and greater than or equal to 0.02 μm.

The first superlattice layer 1023 of the V-pit control layer 102 is utilized to relieve stress that is generated due to differences in lattice parameters and that occurs when the InGaN-containing light-emitting layer 104 is grown above the n-type electron injection layer 1011, which is the n-type GaN layer, thereby enhancing growth quality of crystals as well as luminous brightness of the light-emitting diode.

Each period of the first superlattice layer 1023 has stacked layers of $In_xGa_{1-x}N/In_yGa_{1-y}N$, where x>y, 0<x<1, and 0≤y<1. In some embodiments, an initial layer of the first superlattice layer 1023 is an $In_yGa_{1-y}N$ layer, and a terminal layer of the first superlattice layer 1023 is an $In_xGa_{1-x}N$ layer. In other embodiments, an initial layer of the first superlattice layer 1023 is the $In_xGa_{1-x}N$ layer, and a terminal layer of the first superlattice layer 1023 is the $In_yGa_{1-y}N$ layer. In this embodiment, each period of the first superlattice layer 1023 has stacked layers of InGaN/GaN, an initial layer of the first superlattice layer 1023 is a GaN layer, and a terminal layer of the first superlattice layer 1023 is an InGaN layer. The period number of the first superlattice layer 1023 may range from 3 to 7. The first superlattice layer 1023 has Si doping, and the Si doping concentration of the first superlattice layer 1023 ranges from $5×10^{17}$ atoms/cm$^3$ to $2×10^{18}$ atoms/cm$^3$. In addition, the thickness of the first superlattice layer 1023 ranges from 0.05 μm to 0.2 μm.

The third layer structure 1024 of the V-pit control layer 102 is disposed above the first superlattice layer 1023. The third layer structure 1024 may be an InGaN layer or a GaN layer, and has a thickness ranging from 0.01 μm to 0.1 μm. The Si doping concentration of the third layer structure 1024 ranges from $1×10^{18}$ atoms/cm$^3$ to $1×10^{19}$ atoms/cm$^3$.

Embodiment 3

Figure 8:
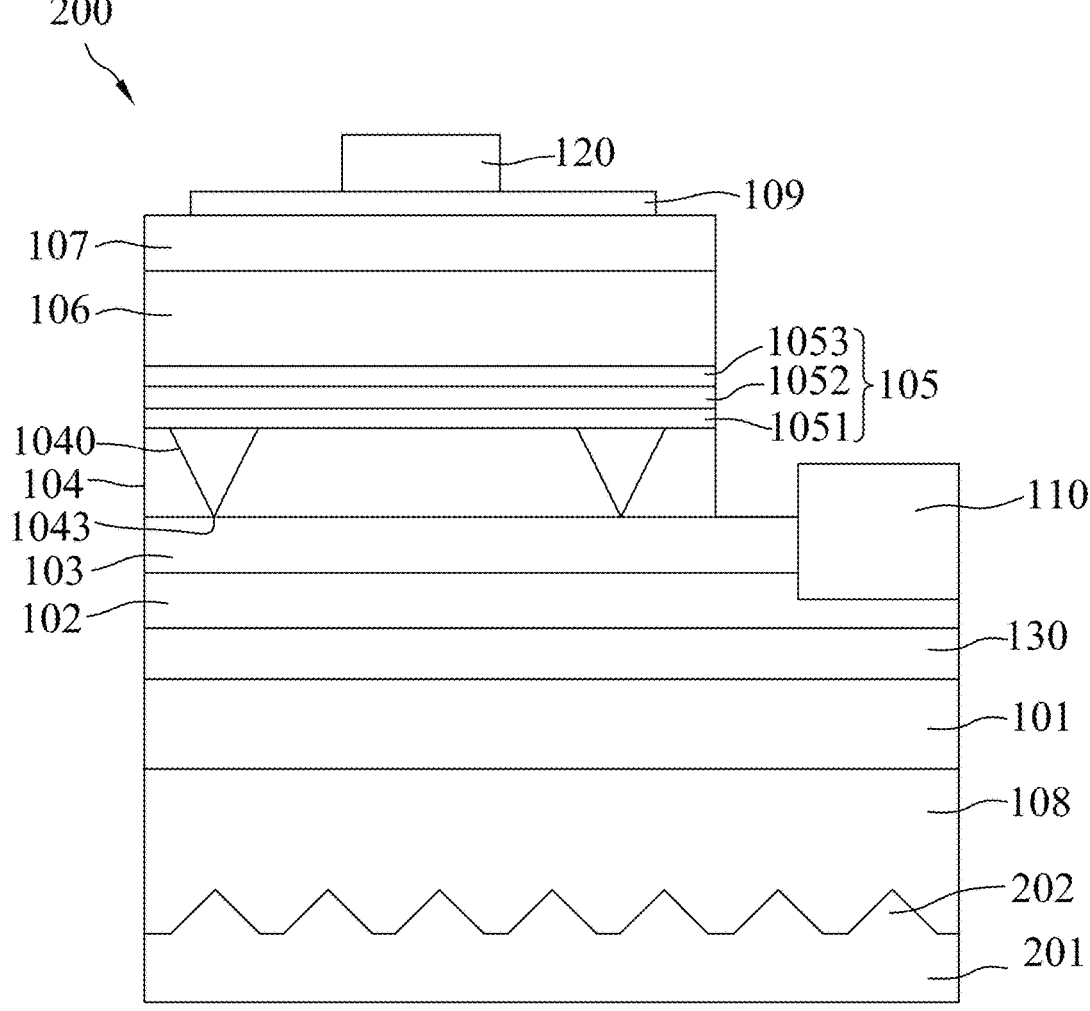
FIG. 8 is a cross-sectional schematic view of a semiconductor light-emitting element of Embodiment 3 according to the disclosure.

Referring to FIGS. 8 and 2, an LED 200 includes a substrate 201 and the epitaxial structure 100 disposed on the substrate 201.

At least one side of the LED 200 has a length not exceeding 300 μm, or not exceeding 200 μm.

Referring to FIG. 8, in some embodiments, the substrate 201 is a patterned substrate with a plurality of pattern structures 202 arranged at intervals on an upper surface thereof. The substrate 201 may be an insulating substrate or a conductive substrate. The substrate 201 is a growth substrate utilized for epitaxial growth of the epitaxial structure 100 of an LED 200 such as a sapphire ($Al_2O_3$) substrate. The substrate 201 includes an upper surface, a lower surface opposite to the upper surface, and a sidewall connecting the upper surface and the lower surface. The pattern structures 202 on the upper surface of the patterned substrate may be formed into a regular pattern and/or an irregular pattern. In this embodiment, forming the epitaxial structure 100 on the patterned substrate can reduce dislocations in the epitaxial structure 100, thereby improving the crystal quality of the epitaxial structure 100.

The patterned substrate (serving as the substrate 201) has a thickness ranging from 40 μm to 150 μm. In some embodiments, the thickness of the patterned substrate ranges from 40 μm to 80 μm. In still some embodiments, the thickness of the patterned substrate ranges from 40 μm to 60 μm.

In order to mitigate the lattice mismatch between the patterned substrate and the electron injection layer 1011 of n-type, a buffer layer 108 is grown between the patterned substrate and the electron injection layer 1011 of n-type. In addition, a lattice constant of the buffer layer 108 must therefore be between a lattice constant of the patterned substrate and a lattice constant of the electron injection layer 1011 of n-type. The buffer layer 108 may be made of a material such as an $Al_{x1}In_{y1}Ga_{(1-x1-y1)}N$, where 0≤x1≤1, and 0≤y1≤1. For instance, the material may be AlN, GaN, AlGaN, AlInGaN, or InGaN. The buffer layer 108 may be manufactured by metal organic chemical vapor deposition (MOCVD) technique or by physical vapor deposition (PVD) technique. In an exemplary embodiment, the buffer layer 108 includes a low-temperature GaN nucleation layer with a thickness ranging from 25 nm to 40 nm, a high-temperature GaN buffer layer with a thickness ranging from 0.2 μm to 1 μm, a two-dimensional GaN layer with a thickness ranging from 1 μm to 2 μm.

Figure 10:
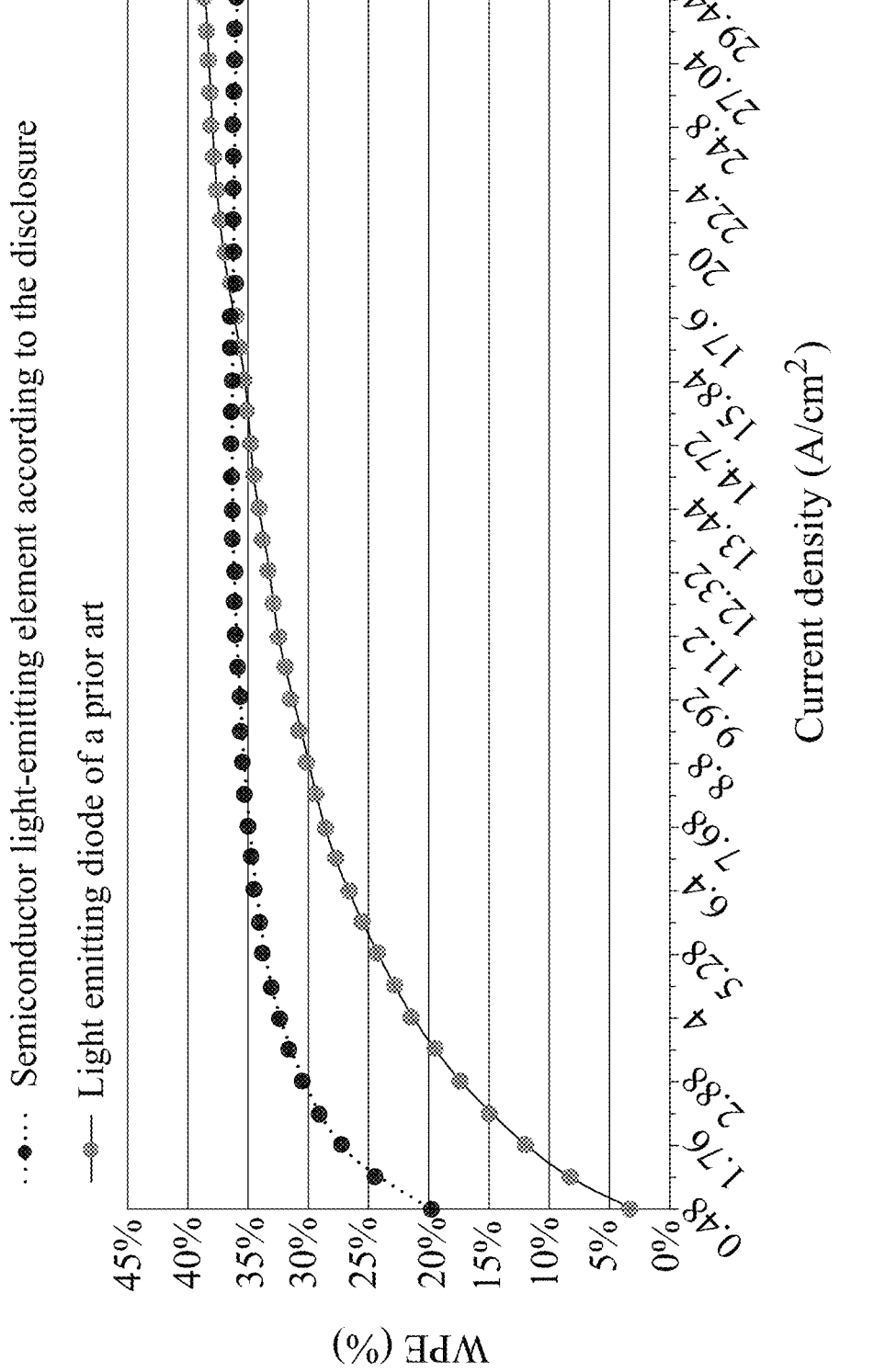
FIG. 10 shows a curve graph illustrating a relationship between the wall-plug efficiency (WPE) and the current density for the semiconductor light-emitting element of FIG. 8.

Referring to FIG. 8, the epitaxial structure 100 of embodiment 1 is formed above the buffer layer 108. The patterned substrate described above is combined with the epitaxial structure 100 that includes the V-pit inducing layer 102. Through a cooperation of the V-pit inducing layer 102 with the In-containing layers of the first superlattice layer 1023, most of the tips 1043 of the V-pits 1040 can be not lower than the initial layer of the light-emitting layer 104, leakage channels in the epitaxial structure 100 can be reduced, and the luminous efficiency of the LED 200, particularly the luminous efficiency under a low current density can be enhanced. Referring to FIG. 10, under a low current density (0 A/cm$^2$ to 20 A/cm$^2$), the wall-plug efficiency (WPE) of the LED 200 according to the disclosure is significantly increased compared to a light-emitting diode of a prior art; especially, when the low current density ranges from 0 A/cm$^2$ to 15 A/cm$^2$, the WPE increases more apparently and can be higher up to more than 3 times.

Referring to FIGS. 8 and 2, the LED 200 further includes an electrode structure, which includes the first electrode 110 and the second electrode 120. The first electrode 110 is formed above the n-type electron injection layer 1011 and is connected to the n-type layer 101. The second electrode 120 is formed above the p-type layer 106 and is connected to the p-type layer 106. Moreover, a transparent conductive layer 109 may further be formed between the second electrode 120 and the p-type layer 106. The transparent conductive layer 109 may formed in ohmic contact with the p-type layer 106, and may be made from at least an oxide of an element selected from the group consisting of Zn, In, Sn, Mg. Specifically, the oxide of the element may be ZnO, $In_2O_3$, $SnO_2$, indium tin oxide (ITO), indium zinc oxide (IZO), gallium-doped zinc oxide (GZO). In this embodiment, the transparent conductive layer 109 may be made of ITO.

Figure 9:
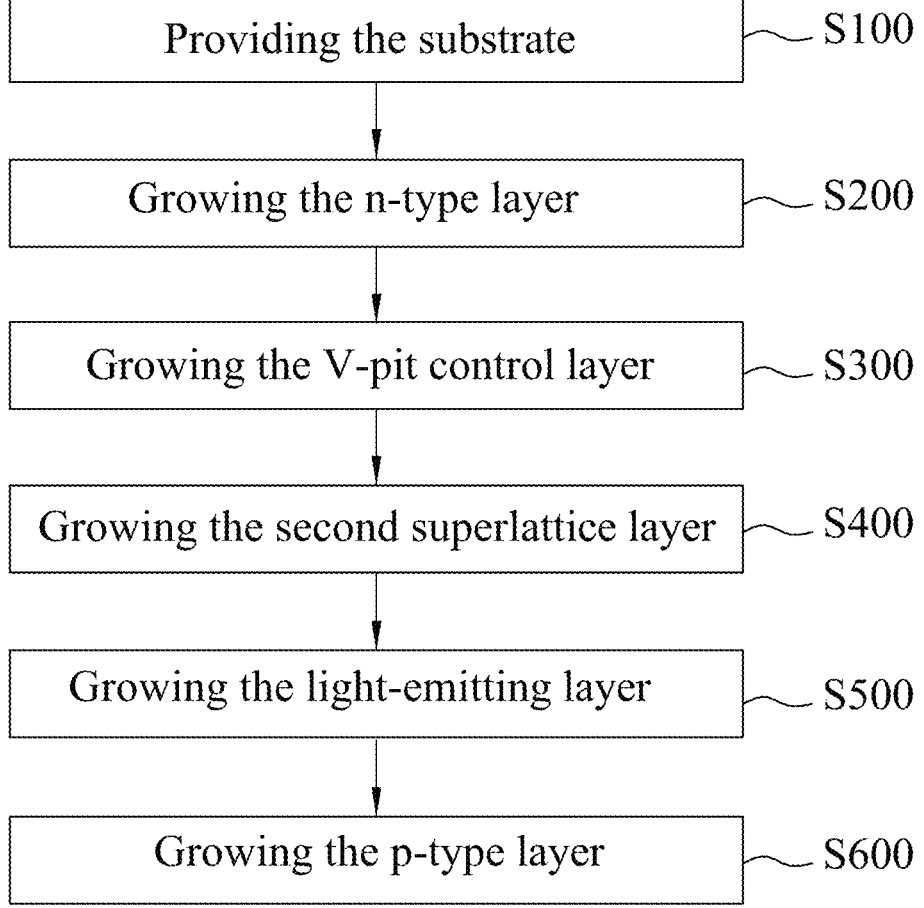
FIG. 9 shows a flow chart illustrating a method for manufacturing the semiconductor light-emitting element of Embodiment 3 according to the disclosure.

Referring to FIG. 9, a method for manufacturing the LED 200 includes the following steps.

S100: The substrate 201 is provided and has the upper surface with the pattern structures 202 periodically arranged thereon. Referring to FIG. 8, the substrate 201 is the patterned substrate that has the pattern structures 202 arranged at intervals on the upper surface thereof.

S200: The n-type layer 101 is grown upon the patterned substrate 201. Referring to FIG. 8, the n-type electron injection layer 1011 is grown on the upper surface of the substrate 201 having the pattern structures 202 thereon. In some embodiments, in order to reduce lattice mismatch between the patterned substrate and the n-type electron injection layer 1011, the buffer layer 108 may be grown on the patterned substrate prior to growing the n-type electron injection layer 1011, and hence the lattice constant of the buffer layer 108 must fall between the lattice constant of the patterned substrate and the lattice constant of the electron injection layer 1011 of n-type. The buffer layer 108 may be made of a material such as an $Al_{x1}In_{y1}Ga_{(1-x1-y1)}N$, where $0 \leq x1 \leq 1$, and $0 \leq y1 \leq 1$. For instance, the material may be AlN, GaN, AlGaN, AlInGaN, or InGaN. The buffer layer 108 may be manufactured by MOCVD technique or PVD technique. In an exemplary embodiment, the buffer layer 108 includes a low-temperature GaN nucleation layer with a thickness ranging from 25 nm to 40 nm, a high-temperature GaN buffer layer with a thickness ranging from 0.2 μm to 1 μm, a two-dimensional GaN layer with a thickness ranging from 1 μm to 2 μm.

Afterward, the electron injection layer 1011 of n-type is grown on the buffer layer 108. The electron injection layer 1011 of n-type is an n-type GaN layer and is configured for providing electrons by doping with an n-type impurity which may be, for instance, Si, Ge, Sn, Se, or Te. In this embodiment, the n-type impurity is Si. The electron injection layer 1011 of n-type has a thickness ranging from 1 μm to 4 μm, and a doping concentration ranging from $1 \times 10^{19}$ atoms/cm$^3$ to $1 \times 10^{20}$ atoms/cm$^3$ so as to provide electrons for radiative recombination. In addition, the electron injection layer 1011 of n-type may be a single-layer structure or a superlattice structure, and the growth temperature thereof may be greater than or equal to 1000° C., for example, may range from 1050° C. to 1150° C.

S300: The V-pit control layer 102 is grown on the n-type layer 101 at a growth temperature ranging from 800° C. to 900° C. Referring to FIGS. 8 and 3, before growing the V-pit control layer 102, the n-type current spreading layer 1012 is grown on the n-type electron injection layer 1011 at a growth temperature greater than or equal to 1000° C. After completion the growth of the n-type current spreading layer 1012 and cooling down to a temperature ranging from 800° C. to 900° C., the first layer structure 1021, the first superlattice layer 1023, and the third layer structure 1024 are sequentially grown above the current spreading layer 1012.

In this embodiment, the V-pit control layer 102 is grown at a relatively low temperature, e.g., a growth temperature ranging from 800° C. to 900° C.

In some embodiments, the V-pit control layer 102 has a C doping concentration not greater than $8 \times 10^{16}$ atoms/cm$^3$, so that the openings of the V-pits can be restricted within the light-emitting layer 104 formed subsequently.

S400: The second superlattice layer 103 is grown upon the V-pit control layer 102 at a growth temperature ranging from 900° C. to 1100° C. The second superlattice layer 103 disposed upon the V-pit control layer 102 is for releasing the stress generated during the growth of the electron injection layer 1011 of n-type. Referring to FIG. 4, in other embodiments, the second superlattice layer 103 is a periodic superlattice structure with narrow bandgap layers 1031 and wide bandgap layers 1032 being stacked alternately, in which each of the narrow bandgap layers 1031 is made of $Al_{y1}Ga_{(1-y1)}N$, and each of the wide bandgap layers 1032 is made of $Al_{x1}Ga_{(1-x1)}N$, where $0.04 \leq x1 \leq 0.12$, and $0 \leq y1 \leq 0.06$. In this embodiment, the period number in the second superlattice layer 103 is 3. In still other embodiments, each of the narrow bandgap layers 1031 is an InGaN layer, and each of the wide bandgap layers 1032 is a GaN layer, an initial layer of the second superlattice layer 103 is one of the InGaN layers, and a terminal layer of the second superlattice layer 103 is one of the GaN layers.

S500: The well layers 1041 and the barrier layers 1042 are stacked alternately above the second superlattice layer 103, so as to form the light-emitting layer 104, and the bandgap energy of the well layers 1041 is less than the bandgap energy of the barrier layers 1042. Additionally, the V-pits 1040 are located within the light-emitting layer 104.

Referring to FIG. 4, the $In_{x2}Ga_{(1-x2)}N$ well layers 1041 and the $Al_{y2}Ga_{(1-y2)}N$ barrier layers 1042 are stacked alternately above the second superlattice layer 103, so as to form the light-emitting layer 104, which is the periodic structure of multiple quantum wells, where $0.08 \leq x2 \leq 0.18$, and $0.02 \leq y2 \leq 0.08$. The bandgap energy of the barrier layers 1042 is greater than the bandgap energy of the well layers 1041. By adjusting the composition ratio of semiconductor materials of the light-emitting layer 104, various wavelengths of lights may be obtained. In some embodiments, the light-emitting layer 104 has 5 to 15 periods of InGaN/GaN. In addition, an initial layer of the light-emitting layer 104 is an InGaN layer and a terminal layer of the light-emitting layer 104 is a GaN layer. The light-emitting layer 104 has a Si doping concentration ranging from $1 \times 10^{17}$ atoms/cm$^3$ to $1 \times 10^{18}$ atoms/cm$^3$, and a thickness not greater than 0.1 μm. Each of the InGaN layers has a thickness ranging from 1 nm to 4 nm, and each of the GaN layers has a thickness ranging from 3 nm to 15 nm. In still some embodiments, the barrier layers 1042 of the light-emitting layer 104 may be doped with a small amount of aluminum, that is to say, each of the barrier layers 1042 is an AlGaN layer. Since a lattice constant of the GaN layers is different from a lattice constant of the InGaN layers, polarization effects is very likely to occur and dislocation defects may consequently arise. If such dislocation defects cannot be effectively controlled, a large number of surface defects may be generated, such as V-pits 1040. The V-pits 1040 may form into leakage channels and as a result, reduce luminous efficiency of an LED.

Because the V-pit control layer 102 is formed above the electron injection layer 1010 of n-type, the tips of the V-pits 1040 can be not lower than a starting position of an initial well layer 1041 of the light-emitting layer 104, that is, a starting position of the well layers 1041 is proximate to the n-type electron injection layer 1011 shown in FIG. 3. Moreover, each of the openings of the V-pits 1040 at the surface of the terminal barrier layer 1042 of the light-emitting layer 104 has a width (D) less than or equal to 200 nm. The V-pit 1040 may be a pyramidal pit, such as a hexagonal pyramidal pit. In such case, the width (D) of the opening of the V-pit is the maximum width of the opening of the hexagonal pyramidal pit.

By controlling the V-pits 1040 as mentioned above, the width of the hole injection channels can be narrowed, thereby diminishing the leakage channels as well as improving the luminous efficiency of the LED 200.

S600: The p-type layer 106 is grown upon the light-emitting layer 104. The p-type layer 106 is a p-type GaN layer and can provide holes by doping with a p-type impurity, such as Mg, Zn, Ca, Sr, or Ba. In this embodiment, the p-type impurity is Mg. In addition, a p-type ohmic contact layer 107 is disposed above the p-type layer 106, and through high doping, for instance, a doping concentration greater than $1\times10^{20}$ atoms/cm$^3$, the p-type layer 106 can form an ohmic contact with a subsequently formed p-type electrode of a nitride-based light-emitting diode. For achieving the purpose of filling up the V-pits, the p-type GaN layer 106 may have a thickness greater than or equal to 100 nm; in certain embodiments, the thickness of the p-type GaN layer may be greater than or equal to 100 nm, but less than or equal to 300 nm, so as to satisfy the foregoing purposes, thereby ensuring that the p-type GaN layer can fill up the V-pits, alleviating a micro-pitting phenomenon in the surface of the epitaxial structure 100, and enhancing the reliability of the nitride-based light-emitting diode.

In order to prevent electrons from overflowing, before growing the p-type layer 106, the electron blocking layer 105 is further formed above the light-emitting layer 104. The electron blocking layer 105 may be an $Al_aIn_bGa_{(1-a-b)}N$ layer, where $0<a\leq1$, and $0\leq b<1$.

Finally, the first electrode 110 and the second electrode 120 are respectively formed above the n-type layer 101 and the p-type layer 106.

Embodiment 4

This embodiment provides a light-emitting device, which includes a circuit substrate and a light-emitting element disposed on the circuit substrate. The light-emitting element may be the semiconductor light-emitting element of Embodiment 2 according to the disclosure. The light-emitting device may be an LED backlight device or a red/green/blue (RGB) display device.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. An epitaxial structure of a semiconductor light-emitting element, comprising an n-type layer, a V-pit control layer, a light-emitting layer and a p-type layer which are stacked sequentially in such order from bottom to top, said light-emitting layer including a plurality of well layers and a plurality of barrier layers stacked alternately, and said well layers having a bandgap energy less than a bandgap energy of said barrier layers;

wherein said V-pit control layer includes a first superlattice layer, a distance between a bottom surface of said V-pit control layer and a bottom surface of said first superlattice layer is less than or equal to 0.15 μm, said bottom surface of said first superlattice layer and a bottom surface of said light-emitting layer have a distance therebetween ranging from 0.05 μm to 0.3 μm, and each of said first superlattice layer and said light-emitting layer is an Indium (In)-containing layer.

2. The epitaxial structure as claimed in claim 1, wherein said V-pit control layer has a carbon (C) doping concentration greater than a C doping concentration of said n-type layer, said C doping concentration of said V-pit control layer being greater than or equal to $2\times10^{16}$ atoms/cm$^3$ and less than or equal to $5\times10^{17}$ atoms/cm$^3$.

3. The epitaxial structure as claimed in claim 2, wherein said V-pit control layer has a silicon (Si) doping concentration ranging from $1\times10^{17}$ atoms/cm$^3$ to $1\times10^{19}$ atoms/cm$^3$.

4. The epitaxial structure as claimed in claim 3, wherein said C doping concentration of said V-pit control layer is greater than or equal to $2\times10^{16}$ atoms/cm$^3$ and less than or equal to $8\times10^{16}$ atoms/cm$^3$.

5. The epitaxial structure as claimed in claim 3, wherein said V-pit control layer is multilayered and at least includes a gallium nitride (GaN) layer.

6. The epitaxial structure as claimed in claim 3, wherein said V-pit control layer has a thickness less than or equal to 0.4 μm.

7. The epitaxial structure as claimed in claim 1, wherein said V-pit control layer further includes a first layer structure disposed below said first superlattice layer, a bottom surface of said first layer structure being said bottom surface of said V-pit control layer, said first layer structure having a Si doping concentration ranging from $2\times10^{18}$ atoms/cm$^3$ to $1\times10^{19}$ atoms/cm$^3$, said Si doping concentration of said first layer structure being greater than a Si doping concentration of said first superlattice layer and a Si doping concentration of a top surface of said n-type layer.

8. The epitaxial structure as claimed in claim 7, wherein said first layer structure has a thickness less than or equal to 0.15 μm and greater than or equal to 0.02 μm.

9. The epitaxial structure as claimed in claim 1, wherein said V-pit control layer further includes a third layer structure disposed above said first superlattice layer, said third layer structure having a Si doping concentration greater than said Si doping concentration of said first superlattice layer, said Si doping concentration of said third layer structure ranging from $1\times10^{18}$ atoms/cm$^3$ to $1\times10^{19}$ atoms/cm$^3$.

10. The epitaxial structure as claimed in claim 9, wherein said third layer structure has a thickness less than or equal to 0.1 μm and greater than or equal to 0.01 μm.

11. The epitaxial structure as claimed in claim 9, wherein said third layer structure has a C doping concentration less than or equal to a C doping concentration of said first superlattice layer.

12. The epitaxial structure as claimed in claim 9, wherein each period of said first superlattice layer of said V-pit control layer has stacked layers of $In_xGa_{1-x}N/In_yGa_{1-y}N$, an initial layer of said first superlattice layer being an $In_yGa_{1-y}N$ layer, and a terminal layer of said first superlattice layer being an $In_xGa_{1-x}N$ layer, where x>y, 0<x<1, and 0≤y<1.

13. The epitaxial structure as claimed in claim 9, wherein each period of said first superlattice layer of said V-pit control layer has stacked layers of $In_xGa_{1-x}N/In_yGa_{1-y}N$, an initial layer of said first superlattice layer being an $In_xGa_{1-x}N$ layer, and a terminal layer of said first superlattice layer being an $In_yGa_{1-y}N$ layer, where x>y, 0<x<1, and 0≤y<1.

14. The epitaxial structure as claimed in claim 9, wherein said third layer structure is an InGaN layer or a GaN layer, said InGaN layer having an In content less than an In content of each of In-containing sublayers of said first superlattice layer.

15. The epitaxial structure as claimed in claim 14, wherein each period of said first superlattice layer of said V-pit control layer has stacked layers of $In_xGa_{1-x}N/In_yGa_{1-y}N$, where x>y, 0<x<1, and 0≤y<1, said third layer structure having a thickness greater than a thickness of an $In_yGa_{1-y}N$ layer of each period of said stacked layers of $In_xGa_{1-x}N/In_yGa_{1-y}N$.

16. The epitaxial structure as claimed in claim 9, wherein a top surface of said third layer structure is in contact with a bottom surface of a first sublayer of said light-emitting layer containing indium.

17. The epitaxial structure as claimed in claim 1, wherein the number of periods of said first superlattice layer is 3 to 7.

18. The epitaxial structure as claimed in claim 1, which further includes a second superlattice layer disposed between said V-pit control layer and said light-emitting layer, said second superlattice layer having a thickness less than or equal to 0.1 μm and greater than or equal to 0.02 μm.

19. The epitaxial structure as claimed in claim 18, wherein said second superlattice layer has a C doping concentration less than or equal to a C doping concentration of said V-pit control layer.

20. The epitaxial structure as claimed in claim 1, wherein said n-type layer includes an electron injection layer and a current spreading layer disposed on said electron injection layer, said current spreading layer being disposed between said V-pit control layer and said electron injection layer, said electron injection layer having a Si doping concentration greater than a Si doping concentration of said current spreading layer, said Si doping concentration of said current spreading layer being less than a Si doping concentration of said V-pit control layer.

21. A semiconductor light-emitting element, comprising an epitaxial structure as claimed in claim 1.

22. A light-emitting device, comprising a semiconductor light-emitting element as claimed in claim 21.

\* \* \* \* \*